United States Patent
Nakamura et al.

[11] Patent Number: 5,197,651
[45] Date of Patent: Mar. 30, 1993

[54] BONDING TOOL

[75] Inventors: Tsutomu Nakamura; Katsuyuki Tanaka; Tetuso Nakai; Takahiro Imai; Akihiko Ikegaya; Naoji Fujimori, all of Itami, Japan

[73] Assignee: Sumitomo Electric Industries, Ltd., Osaka, Japan

[21] Appl. No.: 573,062

[22] Filed: Aug. 24, 1990

[30] Foreign Application Priority Data

Dec. 20, 1989 [JP] Japan .................. 1-332328
May 18, 1990 [JP] Japan .................. 2-129924

[51] Int. Cl.⁵ ............................ B23K 37/00
[52] U.S. Cl. .................. 228/44.7; 228/54
[58] Field of Search .......... 228/44.7, 54, 193, 263.12; 76/DIG. 12

[56] References Cited

U.S. PATENT DOCUMENTS

| | | | |
|---|---|---|---|
| 3,911,246 | 10/1975 | Drinkard, Jr. | 228/54 |
| 3,940,050 | 2/1976 | Johnson et al. | |
| 4,315,128 | 2/1982 | Matcovich et al. | 228/44.7 |
| 4,560,853 | 12/1985 | Ziegel | 76/DIG. 12 |
| 4,605,343 | 8/1986 | Hibbs et al. | 76/DIG. 12 |
| 4,689,276 | 8/1987 | Jacquez | |
| 4,767,050 | 8/1988 | Flood et al. | 228/122 |
| 4,884,476 | 12/1989 | Okuzumi | 76/DIG. 12 |
| 4,940,180 | 7/1990 | Martell | 76/DIG. 12 |
| 5,020,394 | 6/1991 | Nakamura et al. | 76/DIG. 12 |

FOREIGN PATENT DOCUMENTS

| | | |
|---|---|---|
| 0254560 | 1/1988 | European Pat. Off. |
| 0408367A1 | 1/1991 | European Pat. Off. |
| 2183213 | 12/1973 | France |
| 2280472 | 2/1976 | France |
| 8901384 | 2/1989 | PCT Int'l Appl. ........ 228/4.1 |
| 8702749 | 5/1987 | World Int. Prop. O. |

OTHER PUBLICATIONS

IBM Disclosure, "Multipoint Thermocompression Bands," vol. 11 No. 3 Aug. 1968, p. J11.
"Chemical Abstracts", 111(8), 317, abstract no. 62922w (Aug. 21, 1989).
World Patent Index Latest, week 8909, Derwent Publications Ltd., London, GB (JP-A-10 21 076) (Jan. 24, 1989) abstract.

Primary Examiner—Richard K. Seidel
Assistant Examiner—James Miner
Attorney, Agent, or Firm—Wenderoth, Lind & Ponack

[57] ABSTRACT

A bonding tool for TAB, used in the production of semiconductor chips, which is provided with, at the end thereof, a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by gaseous phase synthesis method.

19 Claims, 4 Drawing Sheets

BONDING TOOL

BACKGROUND OF THE INVENTION

1. Field of the Invention

This invention relates to a bonding tool for tape automated bonding, used in a process of producing semiconductor chips, and more particularly, it is concerned with a bonding tool using polycrystalline diamond as a coating of the tool end.

2. Description of the Prior Art

Lately, technical progress in the field of semiconductors has become remarkable and production of the appliances using IC or LSI has shown a yearly increase. In order to draw out the electrical properties these semiconductor elements have, it is required to bond these with metallic fine wires called metal-plated leads or bonding wires. As the metal to be bonded, there is ordinarily used Au or an Au-Sn alloy which is chemically stable and has high electric conductivity and a bonding method comprising thermocompression bonding by means of a bonding tool heated has widely been employed.

Figure 1:
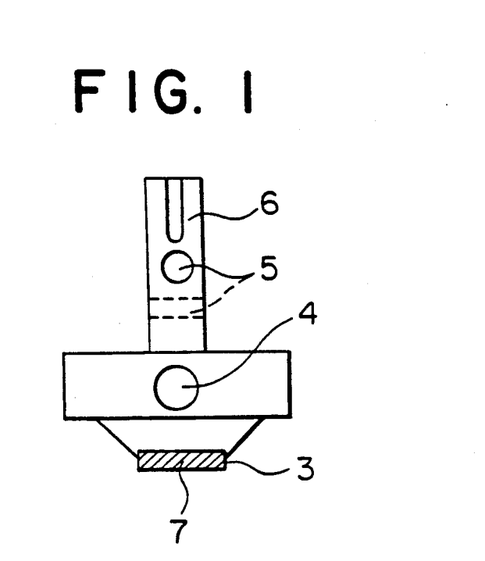
FIG. 1 is a schematic view of one embodiment of the bonding tool of the present invention, which is of a constant heating system and is used for bonding a semiconductor element and metallic fine wire.
Figure 2:
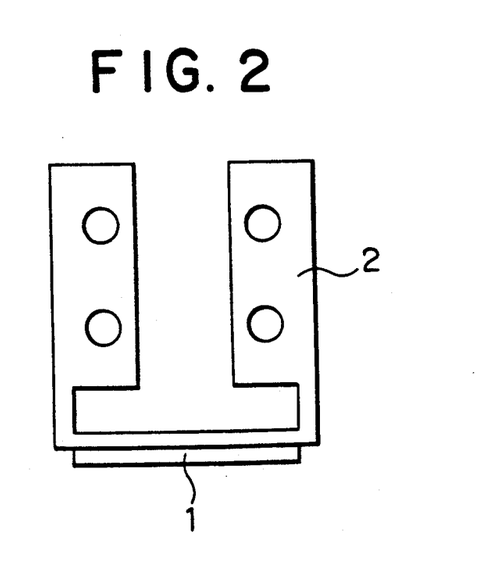
FIG. 2 is a schematic view of another embodiment of the bonding tool of the present invention, which is of a pulse heating system and is used for bonding a semiconductor element and metallic fine wire.

The bonding tool used in the above described thermocompression bonding system can broadly be divided into two categories as shown in FIG. 2 and FIG. 1.

FIG. 2 is a schematic view of a pulse heating system, in which nichrome, stainless steel, inconel or molybdenum is used by subjecting to instantaneous heat generation through passage of electric current. In this system, however, such a material meets with a problem that there occur often oxidation, baking and deformation of the lead thereof at a high temperature and accordingly, it is required to clean periodically the end thereof.

FIG. 1 is a schematic view of a constant heating system, in which a polished single crystal diamond or ruby is buried in the end of a shank having a cartridge heater incorporated, and which is characterized by a longer life than that of the tool of the pulse heating system, in particular, in the case of single crystal diamond. The preferential use of diamond is due to the fact that diamond does not meet with marked thermal deterioration in the air at a temperature of up to about 900° C. and has low compatibility and little reactivity with Au-Sn. In a polished diamond single crystal, its surface state is so good as represented by a Rmax of at most 0.1 $\mu$m and is hardly changed because of its high hardness. Because of this character, the alloy of Au-Sn melted during compression bonding hardly adheres to and remains on the surface of the diamond.

When using diamond having the highest thermal conductivity of all the existing materials as a material for the tool of the steady heating system, furthermore, the tool end can be heated at a desired temperature, e.g. 500° to 600° C. without excessively heating the heater, i.e. shank. However, diamond single crystal is expensive and actually, even a relatively cheap synthetic one can hardly be obtained with a large size such as several mm or more. It is assumed that in the near future, the step of thermocompression bonding a number of terminals will be increased and in this case, a material with a size of at least 10 mm is required.

A diamond sintered compact having a high heat resistance is disclosed in, for example, Japanese Patent Laid-Open Publication No. 114589/1978, in which an iron group metal binder is extracted by treatment with an acid to form pores. In this case, the surface state cannot be rendered good even by polishing because of the presence of the pores so that an Au-Sn alloy tends to adhere thereto during use.

A pore-free, heat-resisting diamond sintered compact is disclosed in Japanese Patent Laid-Open Publication Nos. 161268/1984 and 33865/1986, in which the binder materials are composed of Si, SiC and Ni-Si alloys. In this case, the surface state after polishing is also unsatisfactory, since the hardness of the binder materials is lower than that of diamond.

A sintered compact containing no binder material and consisting of only polycrystalline diamond is considered most desirable as to heat resistance, hardness, thermal conductivity, surface roughness, etc. Thus, it has been proposed to sinter only diamond powder at an ultra-high pressure, but a composite material of diamond-graphite can only be obtained by this method, since diamond grains themselves are hard to deform so that pressure cannot be transmitted to gaps among the grains and consequently, graphitization takes place.

On the other hand, a technique of producing a binder-free polycrystalline diamond compact by a gaseous phase synthesis method has lately made rapid progress and it is considered effective to apply this technique to the bonding tool. As well known in the art, a cutting tool has been put to practical use, which is produced by depositing a thin film of diamond on a substrate of cemented carbide or tungsten by a gaseous phase synthesis method, but even if this is applied to production of the bonding tool, good results cannot be obtained because the bonding strength of the film is too low to prevent this from stripping and occurrence of cracks.

Furthermore, the bonding tool of this kind has other problems. In the bonding tool, a shank and tool end are bonded, for example, by a silver-brazing method, gold-brazing method, thermocompression or sintering bonding method using gold. On the other hand, there are a number of varieties in IC and LSI products, which differ in the number of leads connected and the shape of semiconductors every product. Thus, it is required to prepare an exclusive bonding tool for each IC or LSI product and accordingly, problems arise that the production cost is increased, more time is taken for exchanging the bonding tool and management of the bonding tool becomes complicated.

SUMMARY OF THE INVENTION

It is an object of the present invention to provide a bonding tool for TAB, used for the production of a semiconductor chip.

It is another object of the present invention to provide a bonding tool having a polycrystalline diamond-coated substrate at the end thereof.

It is a further object of the present invention to provide a bonding tool in which the end part thereof and shank are combined by at least one screw or crankpin.

It is a still further object of the present invention to provide a bonding tool in which end end part thereof is combined with a shank of a metal or alloy having a linear expansion coefficient of at most $7.5 \times 10^{-6}$/°C. at from room temperature to 600° C. by the use of a brazing metal or gold formed by thermocompression bonding.

These objects can be attained by a bonding tool provided with, at the end thereof, a substrate consisting of a member selected from the group consisting of sintered compacts of Si of $Si_3N_4$ as a predominant component, sintered compacts of SiC as a predominant component, sintered compacts of AlN as a predominant component and composite compacts thereof, the substrate being coated with polycrystalline diamond deposited by gaseous phase synthesis method.

BRIEF DESCRIPTION OF THE DRAWINGS

The accompanying drawings are to illustrate the principle and merits of the present invention in detail.

FIGS. 6 (a) and (b) are respectively a side view and front view of a further embodiment of the bonding tool of the present invention to illustrate the mode of mechanically combining a tool end with a shank.

FIGS. 7 (a) and (b), FIGS. 8 (a) and (b) and FIGS. 9 (a) and (b) are perspective views of three embodiments of the bonding tool of the present invention to illustrate the mode of combining a tool end with a shank by the use of screws or crankpins.

DETAILED DESCRIPTION OF THE INVENTION

The inventors have made various studies concerning the use of, instead of single crystal diamond, a commercially available sintered diamond compact containing cobalt as a binder with a larger size for the end material of a bonding tool of a constant heating system. This tool was prepared by brazing a blank of such a sintered diamond compact with a shank of stainless steel using a silver braze having a melting point of 750° C. and then subjecting to polishing of the end surface and machining of the shank. The thus polished sintered diamond had a good surface state as represented by a Rmax of 0.06 μm. When the end of the tool was subjected to constant heating at 570° C. can repeated thermocompression bonding of IC chips and Au-Sn wires, it was found that the polished end surface gradually became roughened, resulting in the increase of the adhered amount of the melted Au-Sn alloy, and the end diamond compact was loosened or moved at the brazed area.

Deformation of the end surface is probably due to occurrence of fine cracks, caused by the difference in thermal expansion between the cobalt binder and diamond, and due to lowering of the wear resistance, caused by the progress of graphitization of diamond, because of constant heating of the sintered diamond compact. Furthermore, it can be assumed that loosening of the sintered diamond compact is due to the fact that the temperature of the brazed area is exposed to near the melting point during use and the brazing agent tends to be deformed.

Thus, it is found necessary to provide a high heat resistance material to which a brazing agent with a higher melting point can be applied and which is resistant to heating for a long time, since the commercially available sintered diamond compact containing cobalt as a binder material cannot satisfy the requirements of the tool of this kind.

In view of the foregoing situation, the inventors have made many efforts to obtain more excellent bonding tool materials and consequently, have reached the present invention by choosing a substrate having a good adhesiveness to a coating film.

Accordingly, the present invention provides a more excellent bonding tool which comprises, at the end thereof, a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by vapor phase synthesis method.

Herein, "as a predominant component" means "contained in a proportion of about 50 to 99% by volume".

In the present invention, the coated polycrystalline diamond is preferably oriented in (100) plane and/or (110) plane in the thickness direction from the standpoint of machinability. When the grain diameter of the coated polycrystalline diamond becomes 100 μm or more, the machinability is deteriorated so that it is not desirable from an economical point of view. A suitable film thickness is in the range of 5 to 300 μm, particularly 10 to 80 μm.

FIG. 1 shows one embodiment of the bonding tool of the present invention, in which the end part thereof is coated with diamond. That is, this bonding tool comprises an end part 3 with a diamond coating layer 7 and a shank 6 with radiating hollows 5 and a cartridge heater holder 4.

The thus obtained bonding tool can mainly be used in the constant heating system, but can also be used in the pulse heating system.

A polycrystalline diamond obtained by a gaseous phase synthesis method generally contains amorphous diamond to some extent and in the present invention, the polycrystalline diamond can contain also amorphous diamond as far as the benefits of the present invention are not unfavorably affected.

In the practice of the present invention, in order to obtain a sintered compact to be an excellent bonding tool material, it is required to select a substrate having a co-efficient of thermal expansion similar to that of diamond as well as a good adhesiveness to the coated diamond layer. Furthermore, it is also required for the substrate to have a high heat resistance, since the substrate is exposed to a high temperature, e.g. about 500° to 1000° C. in the step of preparing the tool or when used as the tool. The inventors have found, as a result of studies, that sintered compacts of Si or $Si_3N_4$ as a predominant component, sintered compacts of SiC as a predominant component and sintered compacts of AlN as a predominant component are effective and suitable as a material having these characters. Such a substrate is machined and formed in a desired shape and then coated with polycrystalline diamond by a gaseous phase synthesis method. In this case, the thickness of the substrate is generally, selected in the range of 0.1 to 2.0 mm, depending on the properties of the substrate such as strength and thermal conductivity.

The gaseous phase synthesis method can be carried out by any of known methods, for example, by utilizing thermo-electronic emission or plasma discharge to cause cracking or exciting of a raw material gas or by using a combustion flame to form a film. As the raw material gas, for example, there can generally be used mixed gases of hydrocarbons such as methane, ethane and propane, alcohols such as methanol and ethanol, esters and similar organocarbon compounds with hydrogen, as predominant components. Furthermore, inert gases such as argon, oxygen, carbon monoxide, water, etc. can be contained in the raw material gas in such an amount that the synthetic reaction of carbon and its property cannot be hindered.

The coating film has preferably a thickness of 5 to 300 μm, since if the film thickness is less than 5 μm, cracks tend to occur during polishing the coating surface or during using as a tool, while if more than 300 μm, more time is taken because of a lower deposition speed based on the present technical level, thus resulting in increase of the production cost.

Considering that the upper surface of the coated polycrystalline diamond must be polished and finished in the production of the bonding tool, it is effective to synthesize polycrystalline diamond in such a manner as to be oriented in (100) plane and/or (110) plane in the thickness direction so as to render easy the machinability thereof. In the case of (111) plane, the hardness is too high to improve the machinability. For the same reason, it is preferable to synthesize polycrystalline diamond in such a manner that the grain diameter of the diamond, on the upper surface of the coating, be 0.1 to 100 μm, since if the grain diameter is too small, the areas at the grain boundaries are increased to result in oxidation or deterioration of the surface upon heating in the air.

In the tool material obtained by the above described method, the diamond-coated surface is further polished and finished in such a manner that the surface state is as represented by a Rmax of at most 0.05 μm, comparable to that of single crystal diamond.

This surface-polished tool material can exhibit the feature as a bonding tool material by bonding to a tool base material, for example, by means of brazing.

In another embodiment of the present invention, there is provided a bonding tool comprising a tool end part and a shank, bonded with each other, the tool end part consisting of a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by gaseous phase synthesis method, and the shank partially or wholly consisting of at least one member selected from the group consisting of metals and alloys having a coefficient of linear expansion of at most $7.5° \times 10/°$ C. at a temperature of from room temperature to 600° C.

In this case, the thickness of the substrate is generally selected in the range of 0.5 to 10 mm, preferably 0.5 to 5 mm, depending on the strength of the substrate and the coefficient of linear expansion of the shank.

The gaseous phase synthesis can be carried out by any of known methods in the similar manner to the first embodiment. It is important that the coated polycrystalline diamond has a purity as represented by a non-diamond carbon (Y) to diamond carbon (X) peak ratio (Y/X) of at most 0.2 by Raman spectroscopic analysis, since if this ratio is more than 0.2, i.e. the purity is worse, the quantity of non-diamond carbon contained therein is increased so that the non-diamond carbon is selectively oxidized when heated in the air during using a tool and the surface roughness of the tool end is deteriorated. This is unfavorable.

In the tool material obtained in this way, the diamond-coated surface can further be finished by polishing so that the surface state thereof be comparable to that of diamond single crystal, as represented by a Rmax of at most 0.05 μm.

The thus surface-polished tool material is bonded to a tool base material, for example, by brazing, thus functioning well as a bonding tool material. Generally, the bonding is effectively carried out by a method comprising using a brazing material with a melting point of at least 600° C. or a method using gold formed by thermocompression bonding.

In the former brazing method, there are preferably used, as a brazing metal, alloys comprising 1 to 40% by weight of at least one element selected from the group consisting of Group IVa, Va, VIa and VIIa elements of Periodic Table and the balance of at least one element selected from the group consisting of Group VIII elements of Periodic Table, Cu, Ag, Au, B, In and Sn. Alternatively, the end part of a tool, to be bonded, is coated, in order, with a thin film consisting of a metal, alloy or compound comprising at least one selected from the group consisting of Group IVa, Va, VIa and VIIa elements of Periodic Table and with a thin film consisting of at least one element selected from the group consisting of Group VIII elements of Periodic Table, Cu, Ag, and Au and then bonded to a shank with a brazing metal having a melting point of at least 600° C. via the coated layers. In these methods, the metal, alloy or compound comprising at least one element selected from the group consisting of Group IVa, Va, VIa and VIIa elements of Periodic Table has a function of reacting with polycrystalline diamond to form a carbide and to thus increase the brazing strength.

In the latter gold thermocompression bonding method, it is important for obtaining a high bonding strength that the end part of a tool and/or a shank has a bonding surface coated with, as a bond-strengthening layer, a thin film consisting of a metal, alloy or compound comprising at least one element selected from the group consisting of Group IVa, Va, VIa and VIIa elements of Periodic Table and with, as a diffusion proof layer, a thin film consisting of a metal or alloy comprising at least one element selected from the group consisting of Pt, Pd, W, Mo, Ta and Ni in such a manner that the diffusion proof layer is outside the bond-strengthening layer.

Furthermore, it is important from the standpoint of the bonding strength that at least a part of the shank is composed of a material having a coefficient of thermal expansion similar to that of the tool end part, that is, a metal and/or alloy having a coefficient of linear expansion of at most $7.5 \times 10^{-6}/°C$. at a temperature of from room temperature to 600° C. As such a material, there can preferably be used Kovar alloys, Invar alloys, molybdenum, tungsten, W-Cu alloys, W-Ni alloys and cemented carbides. If necessary, a thermal stress moderating layer consisting of a soft metal such as Cu or Ni can be arranged as a part of the bonding side of the shank.

The coefficients of linear thermal expansion of these materials are as follows:

| Materials | Coefficient of Linear Thermal Expansion ($\times 10^{-6}$/deg) | Remarks |
|---|---|---|
| Diamond | | |

-continued

| Materials | Coefficient of Linear Thermal Expansion ($\times 10^{-6}$/deg) | Remarks |
|---|---|---|
| Single Crystal | 3.1 | |
| Polycrystalline | 3.1 | |
| Mo | 5.7 | |
| W | 4.6 | |
| Invar | 10 | |
| Kovar | 6 | |
| Cemented Carbides | 4.5 | Co: about 5% |
| SUS | 12 | |

Figure 3:
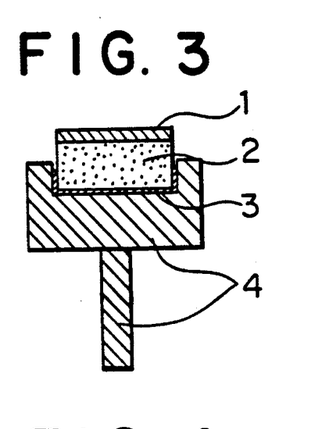
FIG. 3 to FIG. 5 are cross-sectional views of three embodiments of the bonding tool according to the present invention to illustrate the mode of bonding a polycrystalline diamond-coated substrate to a shank.
Figure 4:
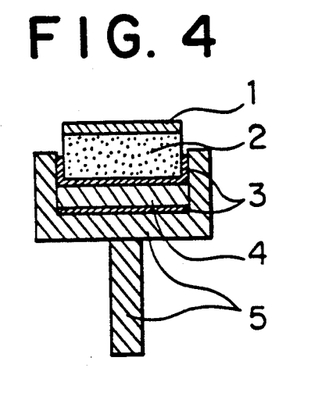
Figure 5:
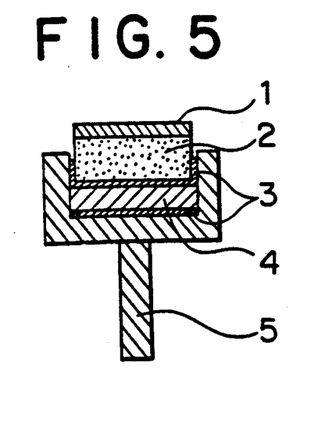

The structures of the bonding tool, in cross-section, are shown, for example, in FIG. 3 to FIG. 5 to illustrate the bonding state. In the case of FIG. 3, the shank is fully composed of the above described material and in the case of FIG. 4, only a part of the shank (shank A), near the tool end, is composed of the above described material. The structure of FIG. 4 is preferably used when the shank material is too expensive or has low machinability, that is, when molybdenum, tungsten or cemented carbides are used as such. In this case, the residual part of the shank, i.e. shank B in FIG. 4 can of course be composed of a material having a large coefficient of thermal expansion such as stainless steels. Referring to FIG. 5, the above described soft metal, as a thermal stress moderating layer, can be inserted in between the tool end part and shank body. The soft metal is subject to plastic deformation to moderate thermal stress and to prevent from lowering of the bonding strength. In any of these structures, the bonding strength reaches a stable value, i.e. at least 10 kg/mm$^2$, which is sufficient for use as a bonding tool.

The inventors have reached a further embodiment of the present invention in the course of studying to solve the problems of the prior art bonding tool used for bonding a semiconductor element and metallic fine wire.

In the bonding tool of this embodiment, a tool end part and a tool shank are combined by at least one screw or crankpin. This is characterized in that the tool end part and shank are fixed in mechanical manner, for example, by a screw or crankpin, whereby the fixing or releasing of the tool end and shank can readily be effected and a number of variations in the shape of the bonding tool can be dealt with by exchanging only the tool end part for another.

Figure 6A:
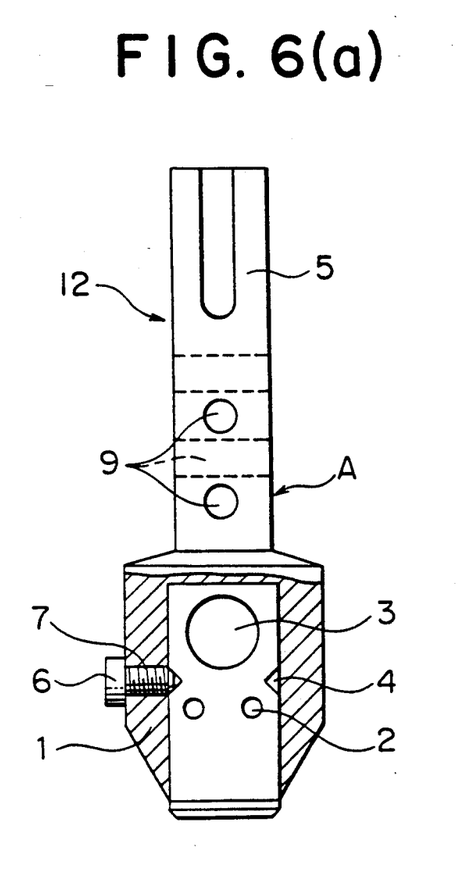
Figure 6B:
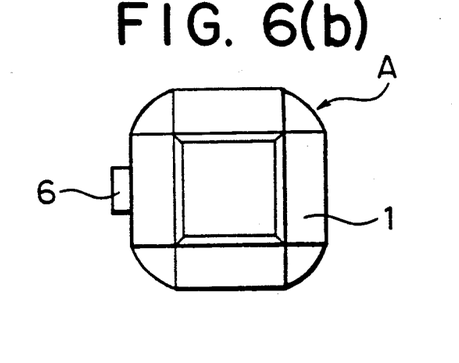

This embodiment will now be illustrated referring to the accompanying drawings. A bonding tool A has such a structure that the bonding tool A is to be fitted to a bonding apparatus (not shown) at a part 5 of a shank 12, as shown in FIG. 6 (a) and (b). A tool end part 1 is fitted to the shank 12 by a setscrew 6 through a tapped hole 7 for fixing a substrate. The tool end part 1 is provided with a thermocouple in a thermocouple holder 2 and a cartridge heater in a cartridge heater holder 3. 4 designates a groove for fixing the substrate, with which the setscrew 6 for fitting the tool end part 1 to the shank 12 is engaged.

After fitting the cartridge heater and thermocouple to the tool end part 1, the bonding tool is heated at a predetermined temperature and subjected to thermocompression bonding of a semiconductor lead wire. When the shape of a semiconductor and the number of lead wires are varied, it is required that the shape of the tool end part is varied to accommodate to the variations, but in many cases, there is no necessity for exchanging the other parts.

In this preferred embodiment, the tool end part is fitted to the shank by mechanical combination, i.e. by the use a screw or caankpin, whereby the fixing or releasing of the tool end part and shank can readily be effected and variations in the shape of a semiconductor and the number of lead wires can fully be dealt with by exchanging only the tool end part for another.

Thus, the bonding tool of this embodiment has advantages over the prior art tools in which the tool end part and shank are bonded by thermocompression bonding or sinter bonding that the production cost can be decreased by 20 to 50% and the time for fitting the tool can be shortened by 30 to 60%.

In this embodiment, as the material of the tool end part, there can be used any of single crystal diamond, diamond sintered compacts, cubic boron nitride sintered compacts, polycrystalline diamond and the like. However, it is preferable in view of the tool life to use, as the tool end part, a substrate consisting of a member selected from the group consisting of sintered compacts of Si or Si$_3$N$_4$ as a predominant component, sintered compacts of SiC as a predominant component, sintered compacts of AlN as a predominant component and composite compacts thereof, the substrate being coated with polycrystalline diamond by gaseous phase synthesis. When using this tool end part, the tool life can be lengthened by two to five times as long as that of the diamond sintered compact or cubic boron nitride sintered compact.

As illustrated above, according to the present invention, it is possible to obtain a bonding tool having more improved heat resistance, strength and wear resistance. The tool material of the present invention is also useful as materials of other heat res:sting and wear resisting tools.

Furthermore, the bonding tool of the present invention has the feature that a number of variations in the shape of the tool end part can fully be dealt with by exchanging only the substrate part of the end part for another. Accordingly, the present invention is largely effective in the field of needing many varieties of bonding tools, for example, in the production of small amounts but many kinds of IC and LSI products.

The following examples are given in order to illustrate the present invention in detail without limiting the same.

EXAMPLE 1

A substrate of SiC sintered compact of 15 mm square and 2 mm thick was fixed to a support base of quartz glass and coated with polycrystalline diamond by a microwave plasma CVD method. A coating of polycrystalline diamond with a thickness of 0.2 mm was obtained for 10 hours under the following conditions:
Raw Material Gas (flow rate):
H$_2$ 200 cc/min,
CH$_4$ 4 cc/min,
Ar 50 cc/min
Pressure: 100 Torr
Output of Microwave Oscillator: 800 W
The polycrystalline diamond in the coating layer had a grain diameter of about 15 $\mu$m and a surface roughness represented by a Rmax of 8.5 $\mu$m.

When the similar procedure was repeated except using Mo as a substrate, on the other hand, polycrystalline diamond was coated with a film thickness of 0.18 mm, grain diameter of 20 μm and surface roughness as represented by a Rmax of 10.5 μm.

In the both cases, the polycrystalline diamonds were oriented in (110) plane in the thickness direction. These coated samples were then subjected to polishing of the coated surface by means of a diamond electrodeposited wheel with a mesh size of No. 200. As a result, in the case of using Mo as a substrate, cracks occurred in the coated film during polishing, resulting in partial stripping thereof, while in the case of using the SiC sintered compact as a substrate, there was obtained such a good surface state as comparable to single crystal diamond and as represented by a Rmax of 0.03 μm without stripping of the film.

The opposite surface of the SiC sintered compact to the thus polished surface was coated, as a pretreatment, with laminated layers of Ti and Ni each having a thickness of 2 μm by a PVD method and then bonded to a tool base material of stainless steel in vacuum at 1100° C. with a brazing metal of an Au-Ta alloy. The thus bonded body was further subjected to polishing and finishing to prepare a bonding tool.

When the bonding tool was fitted to a bonding apparatus and subjected to a durability test, this bonding tool was resistant to use of million times as in the case of a bonding tool prepared using a single crystal diamond of 3 mm square. This example told that the dimension of the bonding surface was enlarged to thus increase the productivity by about 5 times.

EXAMPLE 2

Bonding tool materials as shown in Table 1 were prepared in the similar manner to Example 1. Comparative samples are also shown in Table 1.

TABLE 1

| Sample No. | Substrate | Coating Method of Diamond | Thickness of Diamond Coating Film (μm) | Orientation Plane of Coated Polycrystalline Diamond | Grain Diameter of Upper Surface of Coating (μm) |
|---|---|---|---|---|---|
| 1 | SiC | microwave plasma CVD method | 120 | (111) | 40 |
| 2 | Mo | high frequency plasma CVD method | 80 | (100) | 25 |
| 3 | Si₃N₄ | hot filament method | 2 | (110) | 2 |
| 4 | AlN | microwave plasma CVD method | 180 | (110) | 30 |
| 5 | Si | hot filament method | 280 | (100) | 15 |
| 6 | SiC | high frequency plasma CVD method | 50 | (110) | 5 |
| 7 | Si₃N₄ | combustion flame method | 250 | (110) | 80 |
| 8 | Si₃N₄ | microwave plasma CVD method | 210 | (100) | 150 |
| 9 | Ta | high frequency plasma CVD method | 70 | (100) | 35 |
| 10 | AlN | hot filament method | 220 | (100) | 10 |
| 11 | SiC | hot filament method | 30 | (100) | 8 |

The coated surfaces of these materials and a commercially available sintered diamond compact containing 10 vol % of Co for comparison were subjected to polishing.

Consequently, in the case of Sample No. 3 having a coating thickness of less than 5 μm, cracks occurred during polishing and in the case of Sample Nos. 2 and 9 respectively using Mo and Ta, the coating films were stripped during polishing. Sample No. 1 oriented in (111) plane and Sample 8, in which the grains in the upper surface of the coated polycrystalline diamond were coarse as represented by a diameter of 150 μm, showed such a low machinability that polishing of the overall surface was impossible. The surface roughness of the other samples after polishing is shown in Table 2. These samples were respectively machined to prepare a bonding tool having an end of 20 mm square and then subjected to a durability test in which bonding of IC products each having 1000 pins was repeatedly carried out at an end temperature of 600° C. for a compression time of 2 seconds, thus obtaining results as shown in Table 2. As is evident from the results of Table 2, the bonding tools using the material of the present invention were free from marked deterioration.

TABLE 2

| Sample No. | Surface Roughness Rmax After Polishing | Repetition No. ($\times 10^4$) | Worn State of Tool |
|---|---|---|---|
| 4 | 0.03 | 120 | no marked wear |
| 5 | 0.05 | 120 | no marked wear |
| 6 | 0.04 | 120 | no marked wear |
| 7 | 0.03 | 120 | no marked wear |
| 10 | 0.03 | 120 | no marked wear |
| 11 | 0.04 | 120 | no marked wear |
| Sintered Diamond | 0.06 | 40 | cavity of 2.5 μm on tool end surface |

EXAMPLE 3

A substrate of SiC sintered compact of 15 mm square and 2 mm thick was fixed to a support base of quartz glass and coated with polycrystalline diamond by a microwave plasma CVD method. A coating of polycrystalline diamond with a thickness of 50 μm was obtained for 10 hours under the following conditions:

Raw Material Gas (flow rate):
$H_2$ 200 cc/min,
$CH_4$ 4 cc/min
Ar 50 cc/min
Pressure: 100 Torr
Output of Microwave Oscillator: 800 W The polycrystalline diamond in the coating layer had a grain diameter of about 15 μm and a surface roughness as represented by a Rmax of 8.5 μm.

When the similar procedure was repeated except using Mo as a substrate, on the other hand, polycrystalline diamond was coated with a film thickness of 45 μm, grain diameter of 20 μm and surface roughness as represented by a Rmax of 10.5 μm.

In both the cases, the polycrystalline diamonds were oriented in (110) plane in the thickness direction. The polycrystalline diamonds had a non-diamond carbon (Y) to diamond carbon (X) peak ratio (Y/X) of 0.05 by Raman spectroscopic analysis. These coated samples were then subjected to polishing of the coated surface by means of a diamond electrodeposited wheel with a mesh size of No. 200. As a result, in the case of using Mo as a substrate, cracks occurred in the coated film during polishing, resulting in partial stripping thereof, while in the case of using the SiC sintered compact as a substrate, there was obtained such a good surface state as comparable to single crystal diamond and as represented by a Rmax of 0.03 μm without stripping of the film.

The opposite surface of the SiC sintered compact to the thus polished surface was coated, as a pretreatment, with laminated layers of Ti and Ni each having a thickness of 2 μm by PVD method and then bonded to a shank of Kovar in vacuum of 850° C. with a brazing metal of an Ag-Cu alloy. The thus bonded body was further subjected to polishing and finishing to prepare a bonding tool.

When the bonding tool was fitted to a bonding apparatus and subjected to a durability test, this bonding tool was resistant to use of million times as in the case of a bonding tool prepared using a single crystal diamond of 3 mm square. This example told that the dimension of the bonding surface was enlarged to thus increase the productivity by about 5 times.

EXAMPLE 4

Bonding tool materials as shown in Table 3 were prepared in the similar manner to Example 3. Comparative samples are also shown in Table 3.

The coated surfaces of these materials and a commercially available sintered diamond compact containing 10 vol % of Co for comparison were subjected to polishing.

Consequently, in the case of Sample No. 14 having a coating thickness of less than 5 μm, cracks occurred during polishing and in the case of Sample Nos. 13 and 20 respectively using Mo and Ta, the coating films were stripped during polishing. Sample No. 12 oriented in (111) plane and Sample No. 19, in which the grains in the upper surface of the coated polycrystalline diamond were coarse as represented by a diameter of 150 μm, showed such a low machinability that polishing of the overall surface was impossible. The surface roughness of the other samples after polishing is shown in Table 4. These materials were respectively machined and brazed to a shank of Invar alloy in vacuum at 900° C. using a brazing metal consisting of Cu, Ni and Mn in a proportion of 7:1:2 by weight, after which it was further machined to prepare a bonding tool having an end of 10 mm square. These tools were then subjected to a durability test in which bonding of IC products each having 1000 pins was repeatedly carried out at an end temperature of 520° C. for a compression time of 2 seconds, thus obtaining results as shown in Table 4. As is evident from the results of Table 4, Sample No. 17 having a non-diamond carbon content of more than the preferred range according to the present invention, found by Raman spectroscopic analysis, met with deterioration of the surface roughness, while the bonding tools using the material of the present invention were free from marked deterioration.

TABLE 4

| Sample No. | Surface Roughness Rmax After Polishing | Repetition No. (× 10⁴) | Worn State of Tool |
|---|---|---|---|
| 15 | 0.03 | 120 | no marked wear |
| 16 | 0.05 | 120 | no marked wear |
| 17 | 0.04 | 120 | surface roughness deteriorated to Rmax of 0.25 after using |
| 18 | 0.03 | 120 | no marked wear |
| 21 | 0.03 | 120 | no marked wear |
| 22 | 0.04 | 120 | no marked wear |
| Sintered Diamond | 0.06 | 10 | cavity of 2.5 μm |

EXAMPLE 5

Using a linear tungsten filament of 0.5 mm in diameter and 20 mm in length as a thermoelectron emitting material, a raw material gas comprising hydrogen, a carbon source and steam was subjected to cracking and exciting for 20 hours to form polycrystalline diamond on a SiC substrate with a thickness of 3 mm under conditions as shown in Table 5. The properties of the thus resulting polycrystalline diamond are also shown in Table 5. Bonding tools each having the structure of a tool end part shown in Table 6 was prepared and subjected to a durability test to find that all of these samples were resistant to use of million times as a bonding tool. The bonding strength (shearing strength) was measured using the tool after used to obtain results as shown in Table 6. Sample Nos. 23 to 28 of the present invention showed stable and high bonding strengths.

When the sample was brazed directly to SUS 304 for comparison, the brazing strength was considerably lower, i.e. 2 kg/mm².

TABLE 3

| Sample No. | Substrate | Coating Method of Diamond | Thickness of Diamond Coating Film (μm) | Orientation Plane of Coated Polycrystalline Diamond | Grain Diameter of Upper Surface of Coating (μm) | Raman Peak Ratio (Y/X) |
|---|---|---|---|---|---|---|
| 12 | SiC | microwave plasma CVD method | 120 | (111) | 40 | 0.10 |
| 13 | Mo | high frequency plasma CVD method | 80 | (100) | 25 | 0.15 |
| 14 | Si₃N₄ | hot filament method | 2 | (110) | 2 | 0.08 |
| 15 | AlN | microwave plasma CVD method | 180 | (110) | 30 | 0.18 |
| 16 | Si | hot filament method | 280 | (100) | 15 | 0.05 |
| 17 | SiC | high frequency plasma CVD method | 50 | (110) | 5 | 0.35 |
| 18 | Si₃N₄ | combustion flame method | 250 | (110) | 80 | 0.07 |
| 19 | Si₃N₄ | microwave plasma CVD method | 210 | (100) | 150 | 0.13 |
| 20 | Ta | high frequency plasma CVD method | 70 | (100) | 35 | 0.17 |
| 21 | AlN | hot filament method | 220 | (100) | 10 | 0.04 |
| 22 | SiC | heat filament method | 30 | (100) | 8 | 0.16 |

TABLE 5

| Sample No. | 23 | 24 | 25 | 26 | 27 | 28 |
|---|---|---|---|---|---|---|
| Carbon Source | ethyl alcohol | | | acetylene | | |
| Carbon Source/H₂ (vol %) | 1.5 | 2.3 | 1.8 | 3.0 | 2.0 | 1.6 |
| Amount of H₂O added (vol %) | 0.3 | 0 | 0.01 | 1.2 | 0.2 | 3.5 |
| Gas Flow Rate (SCCM) | 600 | 200 | 1000 | 500 | 300 | 200 |
| Gas Pressure (Torr) | 100 | 150 | 120 | 300 | 80 | 200 |
| Substrate Temperature | 900 | 850 | 850 | 780 | 750 | 820 |

TABLE 5-continued

| Sample No. | 23 | 24 | 25 | 26 | 27 | 28 |
|---|---|---|---|---|---|---|
| (°C.) | | | | | | |
| Filament Temperature (°C.) | 2200 | 2050 | 2100 | 2150 | 2200 | 2250 |
| Substrate-Filament Distance (mm) | 3 | 5 | 4 | 5 | 6 | 5 |
| Electron Current Density (A/cm$^2$) | 0.4 | 1.0 | 0.3 | 0.8 | 0.2 | 0.4 |
| Polycrystalline Diamond Property | | | | | | |
| Thickness (μm) | 55 | 120 | 30 | 160 | 80 | 70 |
| Grain Diameter (μm) | 20 | 5 | 15 | 10 | 30 | 20 |
| Raman Peak Ratio (Y/X) | 0.01 | 0.18 | 0.03 | 0.15 | 0.02 | 0.12 |
| Orientation Plane | (110) | (100) | (110) | (100) | (100) | (110) |

TABLE 6

| Sample No. | Tool Structure | Material of Shank | Bonding Method | Bonding Strength (Kg/mm$^2$) |
|---|---|---|---|---|
| 23 | FIG. 1 | Invar alloy | U | 15 |
| 24 | FIG. 2 | cemented carbide + SUS 304 | S | 12 |
| 25 | FIG. 2 | W + Kovar | T | 20 |
| 26 | FIG. 3 | Ni + Invar alloy | U | 18 |
| 27 | FIG. 1 | Kovar | S | 25 |
| 28 | FIG. 3 | Cu + Kovar | T | 17 |
| 29 | FIG. 1 | SUS 304 | S | 2 |

Note
Bonding Method:
S: using a brazing metal of 60 Ag - 30 Cu - 10 Ti (wt %)
T: coating a surface of a tool end, to be bonded, with TiC and Ni layers each having a thickness of 1 μm and brazing with a brazing metal of 70 Ag - 30 Cu (wt %)
U: coating surfaces of a tool end and shank, to be bonded, with Ta and Pt layers each having a thickness of 1 μm and compression bonding Au.

EXAMPLE 6

Figures 7A, 7B:
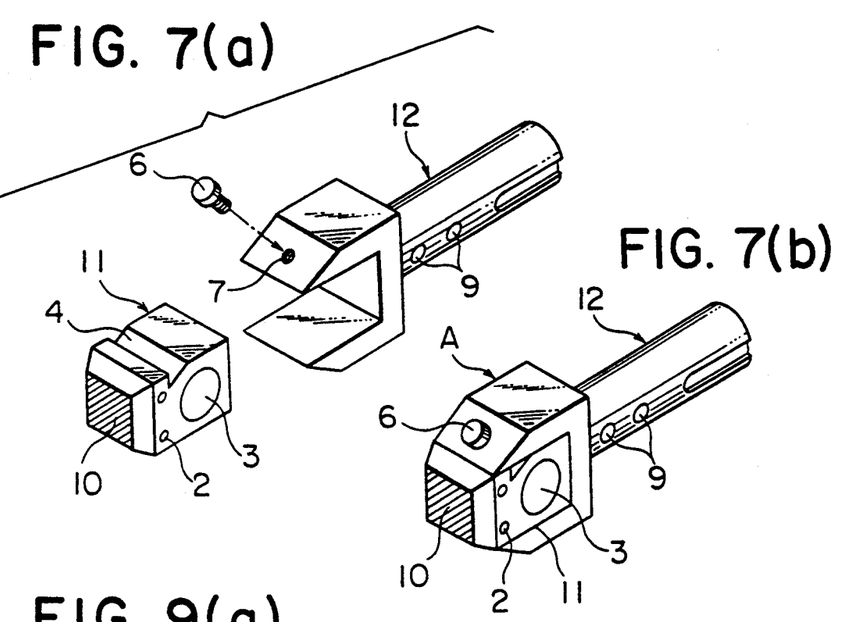

A substrate 11 of SiC sintered compact as shown in FIG. 7(a) was coated with a polycrystalline diamond coating layer 10 with a thickness of 0.1 mm by a microwave plasma CVD method for 10 hours under the following conditions:
Raw Material Gas (flow rate):
H$_2$ 200 cc/min, CH$_4$ 4 cc/min.
Ar 50 cc/min
Pressure: 100 Torr
Microwave Output: 800 W The thus resulting polycrystalline diamond coating layer 10 was polished by a diamond wheel of a mesh size No. 8000, subjected to chamfering of the edge part and then fitted to a shank 12 of stainless steel (SUS 304) by a setscrew 6 pressed to a groove 4 for fixing the substrate through a setscrew hole 7 for fixing the substrate to obtain a bonding tool as shown in FIG. 7(b).

The bonding tool A obtained in this way has a cartridge holding part 3, thermocouple holding part 2 and diamond-coated substrate in the form of one body, whereby the propagation effect on the tool surface is improved to give a temperature gradient of 3.5° C. on a tool surface of 8 mm square at 550° C. and a flatness of 0.3 μm at the same temperature, which can favorably be compared with the prior art bonding tool consisting of a diamond sintered compact having a temperature gradient of 7° C. and flatness of 5 μm at the same temperature.

When this bonding tool was fitted to a bonding apparatus and then subjected to a durability test, it was resistant to use of million times. This was found correspondent to a life of 10 times longer than in the case of carrying out a similar test by an apparatus provided with the bonding tool consisting of a diamond sintered compact, resulting in repeated use of 100000 times.

When the time for exchanging the bonding tools was measured, it was about 1 hour in the case of the prior art tool, but about 30 minutes in the case of the bonding tool of the present invention.

EXAMPLE 7

Figures 8A, 8B:
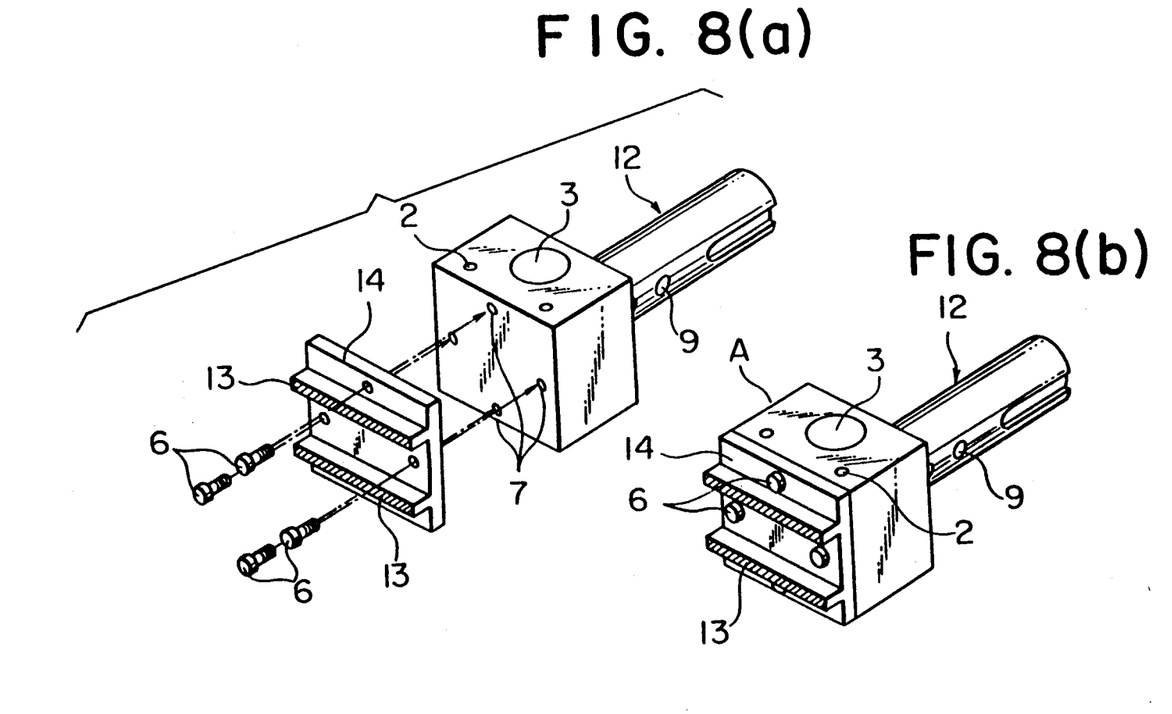

A cemented carbide alloy 14 of 3 mm thick, as a back metal, was bonded to a diamond sintered compact 13 of 1.5 mm thick containing 10 vol % of cobalt as a binder to form a tool end part, as shown in FIG. 8 (a), machined in an analogous manner to Example 6 and then fitted to a shank 12 of inconel by a setscrew system, thus obtaining a bonding tool as shown in FIG. 8 (b).

On the other hand, for comparison, the same tool end part shown in FIG. 8 (a) was fitted to the same shank by silver-brazing according to the prior art.

When these bonding tools were each fitted to a bonding apparatus and then subjected to a durability test, they were resistant to use of 15 × 10$^4$ times, but in particular, the bonding tool of the setscrew system according to the present invention met with no loosening of the combined part even after use and can be produced with a cost of at least 40% lower than the bonding tool of the prior art. Furthermore, the time for fitting the bonding tool to a bonding apparatus can be shortened by at least 50% as compared with the bonding apparatus of the prior art, since this can be done by exchanging the tool end thereof for another.

EXAMPLE 8

Figures 9A, 9B:
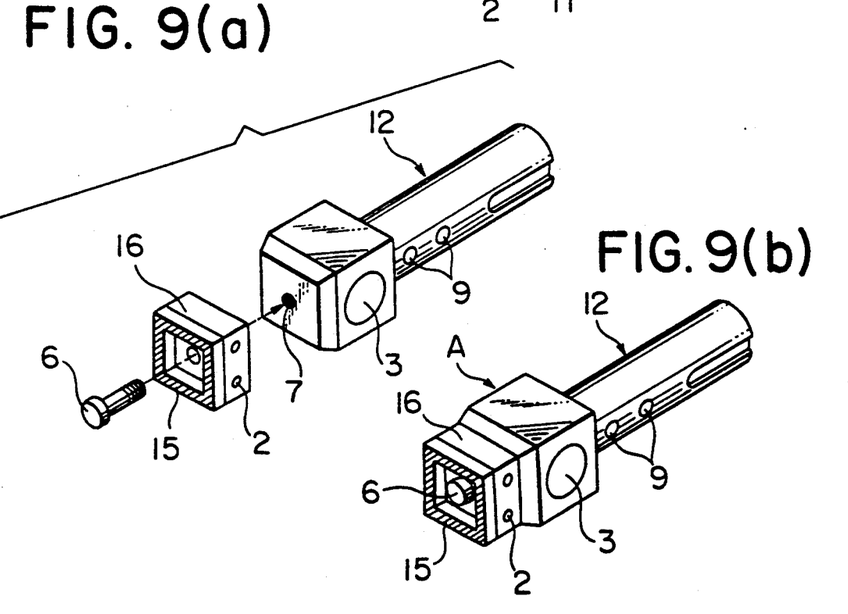

A tungsten alloy 16 with a thickness of 7 mm, as a back metal, was bonded to a cubic boron nitride with a thickness of 1.5 mm containing no binder, as shown in FIG. 9 (a), to form a tool end part, machined in an analogous manner to Example 6 and then fitted to a shank 12 of an iron-nickel-cobalt alloy by a setscrew system, thus obtaining a bonding tool as shown in FIG. 9 (b).

On the other hand, for comparison, cubic boron nitride was directly fitted to a shank of the iron-nickel-cobalt alloy by Au-brazing to obtain a bonding tool.

When these bonding tools were each subjected to measurement of the difference of temperature distribution at 550° C. and flatness at the same temperature, they were respectively 2.5° C. and 0.20 μm in the case of the bonding tool of this example, comparable to 2.7° C. and 0.18 μm in the case of the Au-brazed bonding tool.

When these bonding tools were each fitted to a bonding apparatus and then subjected to a durability test, they were resistant to use of 20 × 10$^4$ times, but in particular, the bonding tool of the setscrew system according to the present invention met with no loosening of the combined part even after use. Furthermore, the bonding tool of this example can be produced with a cost of about 40% lower than the bonding tool of the prior art, as in Example 7, and the time for fitting the bonding tool to a bonding apparatus can be shortened by at least 50% as compared with the bonding tool of the prior art.

What is claimed is:

1. A bonding tool comprising a tool end part and a shank, bonded with each other, the tool end part consisting of a substrate consisting of a member selected from the group consisting of sintered compacts of Si or Si$_3$N$_4$ as a predominant component, sintered compacts of SiC as a predominant component, sintered compacts of AlN as a predominant component and composite compacts thereof, the substrate being coated with polycrystalline diamond deposited by gaseous phase synthesis method, and the shank partially or wholly consisting of at least one member selected from the group consisting of metals and alloys having a coefficient of linear expansion of at most $7.5 \times 10^{-6}/°C$. at a temperature of from room temperature to 600° C.

2. The bonding tool as claimed in claim 1, wherein the substrate has a thickness of 0.5 to 10 mm.

3. The bonding tool as claimed in claim 1, wherein the polycrystalline diamond has a thickness of 5 to 300 μm.

4. The bonding tool as claimed in claim 1, wherein the coated polycrystalline diamond has a purity as represented by a non-diamond carbon (Y) to diamond carbon (X) peak ratio (Y/X) of at most 0.2 by Raman spectroscopic analysis.

5. The bonding tool as claimed in claim 1, wherein the coated polycrystalline diamond is oriented in at least one of (100) plane and (110) plane.

6. The bonding tool as claimed in claim 1, wherein the tool end part and shank are bonded by a brazing metal having a melting point of at least 600° C.

7. The bonding tool as claimed in claim 6, wherein the brazing metal is an alloy consisting of 1 to 40% by weight of at least one element selected from the group consisting of Group IVa, Va, VIa and VIIa elements of Periodic Table and the balance of at least one element selected from the group consisting of Group VIII elements of Periodic Table, Cu, Ag, Au, B, In and Sn.

8. The bonding tool as claimed in claim 6, wherein the surface of the tool end, to be bonded, is coated, in order, with a thin film consisting of a metal, alloy or compound comprising at least one element selected from the group consisting of Group IVa, Va, VIa and VIIa elements of Periodic Table and with a thin film consisting of at least one element selected from the group consisting of Group VIII elements of Periodic Table, Cu, Ag and Au, and then bonded to a shank with a brazing metal having a melting point of at least 600° C. through the coated layers.

9. The bonding tool as claimed in claim 1, wherein the bonding of the tool end part and shank is carried out by by thermocompression bonding using gold and wherein the surface to be bonded of at least one of the tool end part and shank is coated with, as a bond-strengthening layer, a thin film consisting of a metal, alloy or compound comprising at least one element selected from the group consisting of Group IVa, Va, VIa and VIIa elements of Periodic Table and with, as a diffusion proof layer, a thin film consisting of a metal or alloy comprising at least one element selected from the group consisting of Pt, Pd, W, Mo, Ta and Ni in such a manner that the diffusion proof layer is outside the bond-strengthening layer.

10. The bonding tool as claimed in claim 1, wherein at least a part of the shank is composed of a material selected from the group consisting of Kovar alloys, Invar alloys, Mo, W, W-Cu alloys, W-Ni alloys and cemented carbides.

11. The bonding tool as claimed in claim 1, wherein the shank is provided with, at a part of the bonding surface thereof, a thermal stress moderating layer consisting of a soft metal such as Cu or Ni.

12. The bonding tool as claimed in claim 1, wherein the diamond-coated surface is further polished to give a surface roughness as represented by a Rmax of at most 0.05 μm.

13. The bonding tool as claimed in claim 1 wherein said sintered compact is $Si_3N_4$.

14. A bonding tool comprising a tool end part and a tool shank, wherein the tool end part and tool shank are combined by at least one screw or crankpin and wherein the tool end part consists of a substrate consisting of a member selected from the group consisting of sintered compacts of Si, $Si_3N_4$, SiC and AlN and composite compacts thereof, as a predominant component, the substrate being coated with polycrystalline diamond deposited by gaseous phase synthesis method.

15. A bonding tool comprising a tool end part and a tool shank, wherein the tool end part and tool shank are combined by at least one screw or crankpin and wherein the tool end part consists of polycrystalline diamond, single crystal diamond and polycrystalline cubic boron nitride.

16. A bonding tool comprising a tool end part and a shank, bonded with each other, the tool end part consisting of a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by the gaseous phase synthesis method, wherein the tool end part and shank are bonded by a brazing metal having a melting point of at least 600° C. and wherein the brazing metal is an alloy consisting of 1 to 40% by weight of at least one element selected from the group consisting of Group IVa, Va, VIa and VIIa elements of the Periodic Table and the balance of at least one element selected from the group consisting of Group VIII elements of the Periodic Table, Cu, Ag, Au, B, In and Sn.

17. A bonding tool comprising a tool end part and a shank, bonded with each other, the tool end part consisting of a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by the gaseous phase synthesis method, wherein the tool end part and shank are bonded by a brazing metal having a melting point of at least 600° C. and wherein the surface of the tool end, to be bonded, is coated, in order, with a thin film consisting of a metal, alloy or compound comprising at least one element selected from the group consisting of Group IVa, Va, VIa and VIIa elements of the Periodic Table and with a thin film consisting of at least one element selected from the group consisting of Group VIII elements of the Periodic Table, Cu, Ag and Au, and then bonded to a shank with a brazing metal having a melting point of at least 600° C. through the coated layers.

18. A bonding tool comprising a tool end part and a shank, bonded with each other, the tool end part consisting of a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by the gaseous phase synthesis method,
  wherein the bonding of the tool end part and shank is carried out by thermocompression bonding using gold and
  wherein the surface to be bonded of at least one end of the tool end part and shank is coated with, as a bond-strengthening layer, a thin film consisting of a metal, alloy or compound comprising at least one element selected from the group consisting of Group IVa, Va, VIa and VIIa elements of the Periodic Table and with, as a diffusion proof layer, a thin film consisting of a metal or alloy comprising at least one element selected from the group consisting of Pt, Pd, W, Mo, Ta and Ni in such a manner that the diffusion proof layer is outside the bond-strengthening layer.

19. A bonding tool comprising a tool end part and a shank, bonded with each other, the tool end part consisting of a substrate consisting of a member selected from the group consisting of sintered compacts of Si or $Si_3N_4$ as a predominant component, sintered compacts of SiC as a predominant component, sintered compacts of AlN as a predominant component and composite compacts thereof, the substrate being coated with polycrystalline diamond deposited by the gaseous phase synthesis method, and
  wherein the shank is provided with, at a part of the bonding surface thereof, a thermal stress moderating layer consisting of a soft metal such as Cu or Ni.

* * * * *